United States Patent
Dhaoui et al.

(10) Patent No.: US 7,342,278 B2
(45) Date of Patent: Mar. 11, 2008

(54) NON-VOLATILE TWO-TRANSISTOR PROGRAMMABLE LOGIC CELL AND ARRAY LAYOUT

(75) Inventors: Fethi Dhaoui, Patterson, CA (US); John McCollum, Saratoga, CA (US); Vidyahara Bellippady, Cupertino, CA (US); Zhigang Wang, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/750,650

(22) Filed: May 18, 2007

(65) Prior Publication Data

US 2007/0215935 A1  Sep. 20, 2007

Related U.S. Application Data

(62) Division of application No. 11/155,005, filed on Jun. 15, 2005.

(51) Int. Cl.
*H01L 29/788* (2006.01)
(52) U.S. Cl. .................. 257/316; 257/317; 257/321
(58) Field of Classification Search ........ 257/314–317, 257/319–321
See application file for complete search history.

(56) References Cited

U.S. PATENT DOCUMENTS

| | | | |
|---|---|---|---|
| 5,510,730 | A | 4/1996 | El Gamal et al. |
| 5,587,603 | A | 12/1996 | Kowshik |
| 5,625,211 | A | 4/1997 | Kowshik |
| 5,640,344 | A | 6/1997 | Pani et al. |
| 5,740,106 | A | 4/1998 | Nazarian |
| 5,847,993 | A | 12/1998 | Dejenfelt |
| 6,144,580 | A | 11/2000 | Murray |
| 6,252,273 | B1 | 6/2001 | Salter, III et al. |
| 6,356,478 | B1 | 3/2002 | McCollum |
| 2004/0114436 | A1 | 6/2004 | Hecht et al. |
| 2004/0233736 | A1 | 11/2004 | Auricchio et al. |

*Primary Examiner*—Thien F Tran
(74) *Attorney, Agent, or Firm*—Sierra Patent Group, Ltd.

(57) ABSTRACT

A two-transistor non-volatile memory cell is formed in a semiconductor body. A memory-transistor well is disposed within the semiconductor body. A switch-transistor well is disposed within the semiconductor body and is electrically isolated from the memory transistor well. A memory transistor including spaced-apart source and drain regions is formed within the memory-transistor well. A switch transistor including spaced-apart source and drain regions is formed within the switch-transistor well region. A floating gate is insulated from and self aligned with the source and drain regions of the memory transistor and switch transistor. A control gate is disposed above and aligned to the floating gate and with the source and drain regions of the memory transistor and the switch transistor.

20 Claims, 6 Drawing Sheets

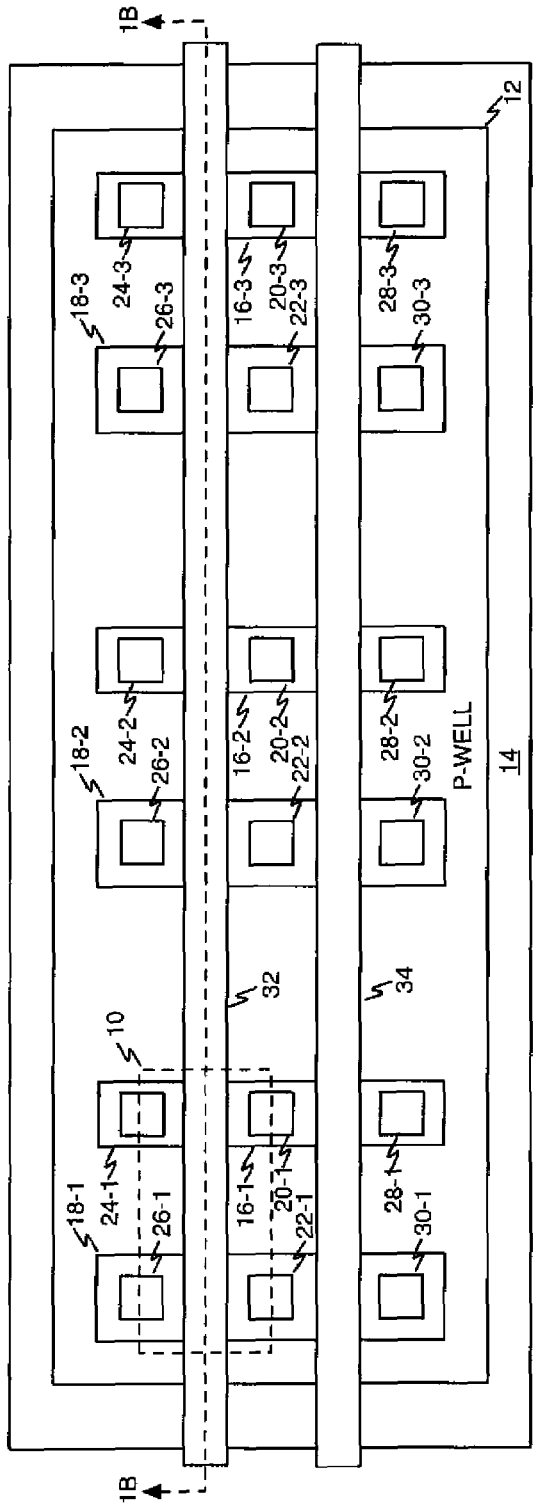
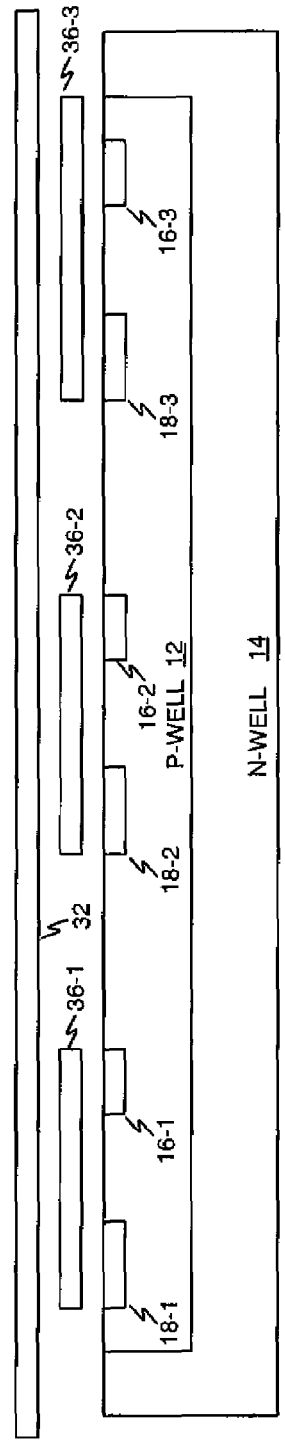
FIGURE 1A (PRIOR ART)
FIGURE 1B (PRIOR ART)

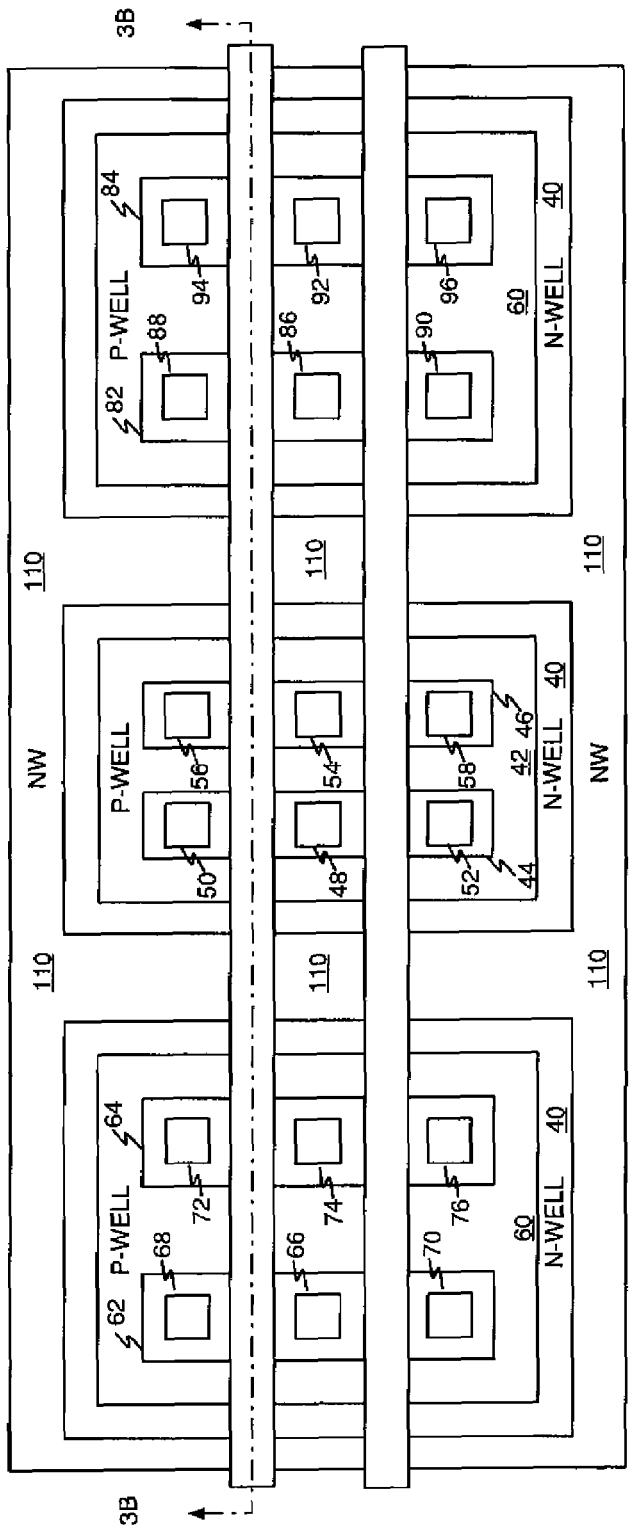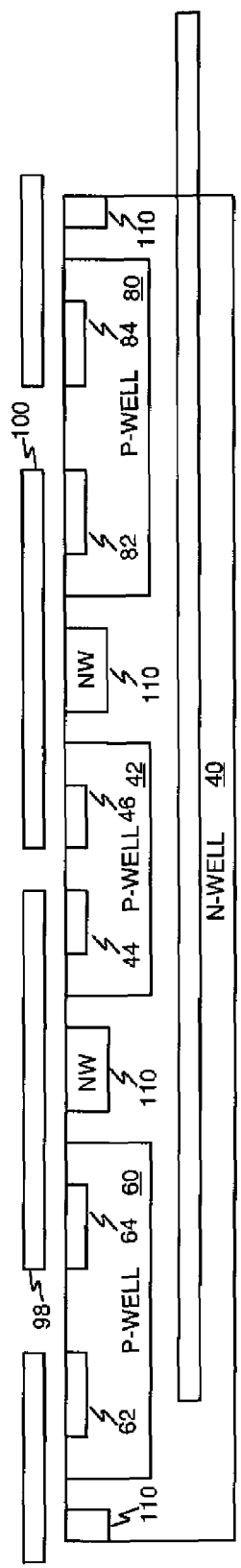
FIGURE 3A
FIGURE 3B

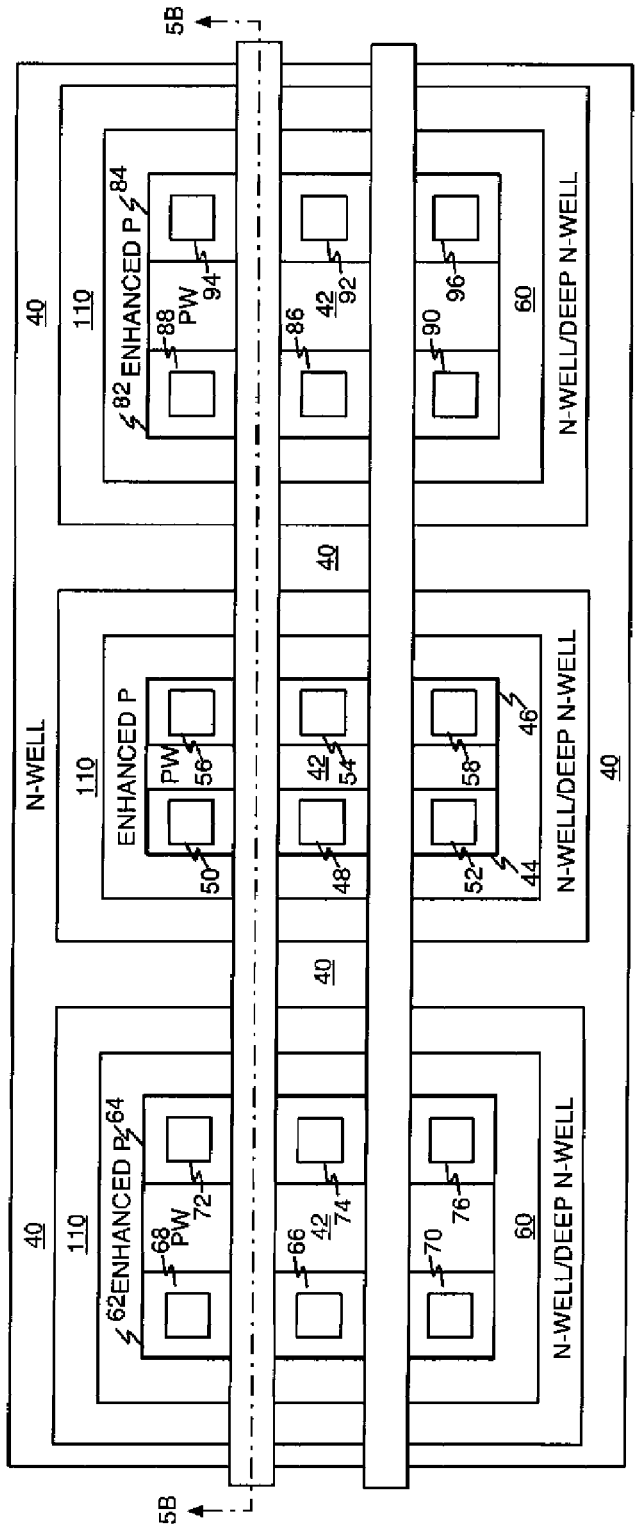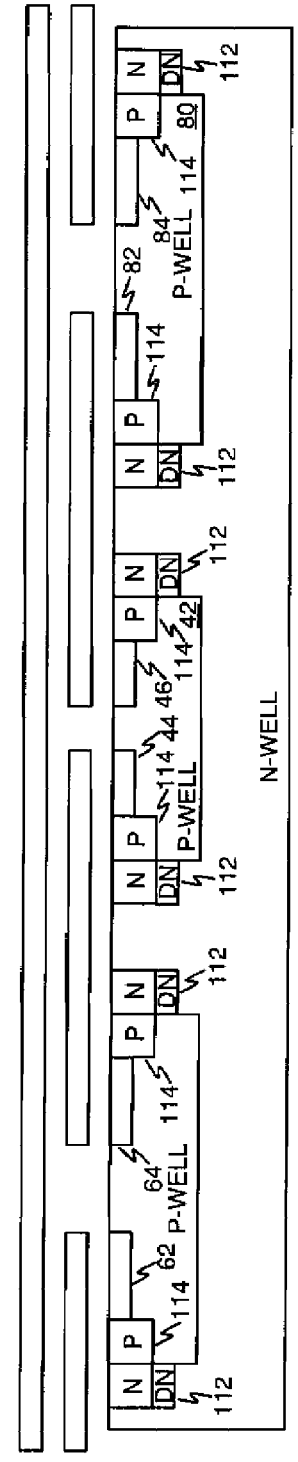
FIGURE 5A
FIGURE 5B

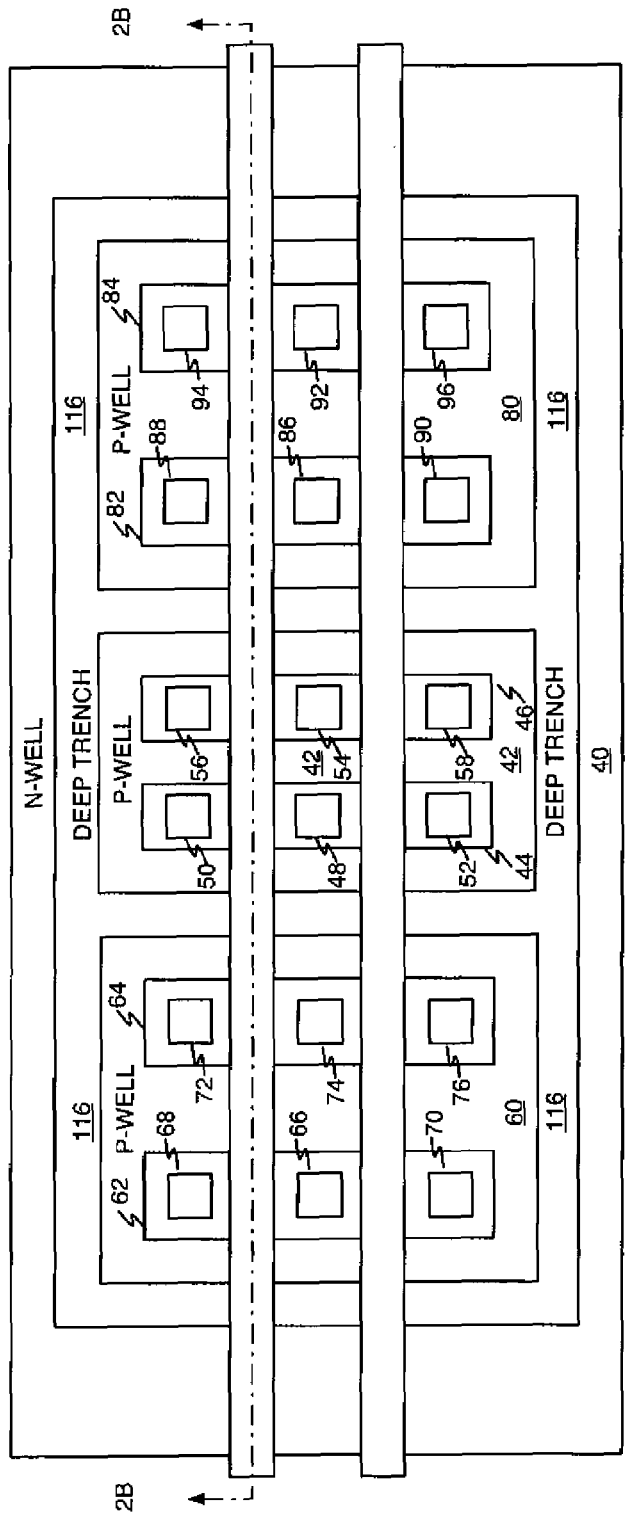
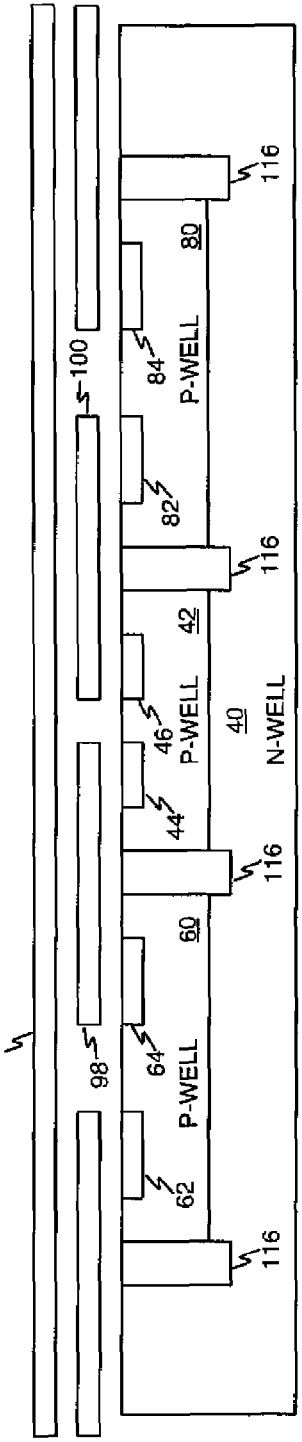
FIGURE 6A
FIGURE 6B

US 7,342,278 B2

NON-VOLATILE TWO-TRANSISTOR PROGRAMMABLE LOGIC CELL AND ARRAY LAYOUT

CROSS-REFERENCE TO RELATED APPLICATION

This application is a divisional of co-pending U.S. patent application Ser. No. 11/155,005, filed Jun. 15, 2005, which is hereby incorporated by reference as if set forth herein.

BACKGROUND OF THE INVENTION

1. Field of the Invention

The present invention relates to programmable integrated circuits. More specifically, the present invention relates to layouts for non-volatile memory cells and arrays.

2. The Prior Art

Two-transistor non-volatile memory cells for use in programmable integrated circuits are known in the art. FIGS. 1A and 1B are, respectively, top and cross sectional views of an illustrative group of three pairs of two-transistor non-volatile memory cells. The cross sectional view of FIG. 1B is taken through the dashed line 1B-1B in FIG. 1A.

Each two-transistor non-volatile memory cell (one of which is shown in dashed rectangle 10) of FIG. 1A and is shown formed inside of a p-type well shown at reference numeral 12 formed within an n-type well 14. Each two-transistor non-volatile memory includes a memory transistor and a switch or pass transistor controlled by the memory transistor, disposed within the p-type well. The memory transistor is used to program and erase the cell. The switch transistor may be used, for example, to make interconnections in an FPGA. The memory transistors are formed from portions of active regions 16-1, 16-2, and 16-3, shown at the right side of each two-transistor non-volatile memory cell and the switch transistors are formed by portions of active regions 18-1, 18-2, and 18-3, shown at the left side of each two-transistor non-volatile memory cell.

Persons of ordinary skill in the art will observe that mirrored pairs of memory transistors and switch transistors are shown in p-type well 12 in FIGS. 1A and 1B. Contacts 20-1, 20-2, and 20-3 form the common source connections for each pair of memory transistors and contacts 22-1, 22-2, and 22-3 form the common source connections for each pair of switch transistors. Contacts 24-1, 24-2, and 24-3 connect to the drains of the first of the memory transistors in each pair of cells and contacts 26-1, 26-2, and 26-3 connect to the drains of the second of the memory transistors in each pair of cells. Contacts 28-1, 28-2, and 28-3 connect to the drains of the first of the switch transistors in each pair of cells and contacts 30-1, 30-2, and 30-3 connect to the drains of the second of the switch transistors in each pair of cells.

Common control gate 32 is associated with the first memory and switch transistors of all of the two-transistor non-volatile memory cells and common control gate 34 is associated with the second memory and switch transistors of all of the two-transistor non-volatile memory cells. Floating gate segments 36-1, 36-2, and 36-3, respectively, are common to the first memory and switch transistors in the three cell pairs shown and floating gate segments (hidden under control gate 32 and not shown in FIG. 1A) are common to the second memory and switch transistors in the three cell pairs shown in FIGS. 1A and 1B. As will be appreciated by persons of ordinary skill in the art, the floating gate segments are aligned with the control gates with which they are associated.

The programming, erasing, and normal-mode operating of the two-transistor, non-volatile memory cells shown in FIGS. 1A and 1B are all well known to persons of ordinary skill in the art. Briefly, the two-transistor non-volatile memory cell is programmed using the memory transistor. Because the memory transistor and the switch transistor share the same floating gate, the switch transistor is either turned off or turned on depending on the programmed or erased state of the memory transistor.

As can be seen from an examination of FIGS. 1A and 1B the memory transistors are smaller than the switch transistors. As will be appreciated by persons of ordinary skill in the art, this makes the memory transistors easier to program and also allows the switch transistors to have a low on resistance.

While the two-transistor memory cells shown in FIGS. 1A and 1B function satisfactorily for their intended purpose, there remains room for improvement in the technology.

BRIEF DESCRIPTION OF THE INVENTION

A two-transistor non-volatile memory cell is formed in a semiconductor body. A memory-transistor well is disposed within the semiconductor body. A switch-transistor well is disposed within the semiconductor body and is electrically isolated from the memory-transistor well. A memory transistor through which the cell may be programmed and erased is formed within the memory-transistor well and includes spaced-apart source and drain regions. A switch transistor that may be used to make interconnections between circuit elements is formed within the switch-transistor well region and includes spaced-apart source and drain regions. A floating gate is insulated from and self aligned with the source and drain regions of the memory transistor and the switch transistor. A control gate is disposed above and self aligned with respect to the floating gate and with the source and drain regions of the memory transistor and the switch transistor.

An array of two-transistor non-volatile memory cells is formed in a semiconductor body. A memory-transistor well is disposed within the semiconductor body. A switch-transistor well is disposed within the semiconductor body and is electrically isolated from the memory-transistor well. A plurality of memory transistors are formed within the memory transistor well, each including spaced-apart source and drain regions. A plurality of switch transistors are formed within the switch-transistor well region, each associated with one of the memory transistors and including spaced-apart source and drain regions. Each memory transistor includes a floating gate insulated from and self-aligned with the source and drain regions of the switch transistor with which it is associated. Each memory transistor also includes a control gate disposed above and self aligned with its floating gate and with the source and drain regions of the at least one switch transistor with which it is associated. More than one switch transistor may be associated with a memory transistor.

According to another aspect of the present invention, because the memory transistors and the switch transistor are disposed in different wells, the characteristics of the memory-transistor wells and transistors, and the characteristics of the switch-transistor wells and transistors can be separately optimized for the different performance characteristics desired for each of these devices.

BRIEF DESCRIPTION OF THE DRAWING FIGURES

FIGS. 1A and 1B are, respectively, top and cross-sectional views of a layout of a group of prior-art two-transistor non-volatile memory cells.

FIGS. 3A and 3B are, respectively, top and cross-sectional views of a layout of a group of two-transistor non-volatile memory cells according to another aspect of the present invention employing common n-type well isolation and n-type well isolation.

FIGS. 5A and 5B are, respectively, top and cross-sectional views of a layout of a group of two-transistor non-volatile memory cells according to another aspect of the present invention employing common n-type well isolation and n-type well isolation with underlying deep n-type well isolation as well as enhanced p-type well isolation.

FIGS. 6A and 6B are, respectively, top and cross-sectional views of a layout of a group of two-transistor memory cells according to another aspect of the present invention employing deep-trench isolation.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons. For example, although exemplary embodiments of the invention are disclosed employing n-channel transistors disposed in p-type bulk regions, p-type transistors disposed in n-type bulk regions may also be employed. In addition, well isolation techniques are disclosed herein, but persons of ordinary skill in the art will appreciate that other isolation techniques, such as silicon on insulator (SOI), may be employed to form the two-transistor non-volatile memory cells and arrays of the present invention.

Figure 2A:
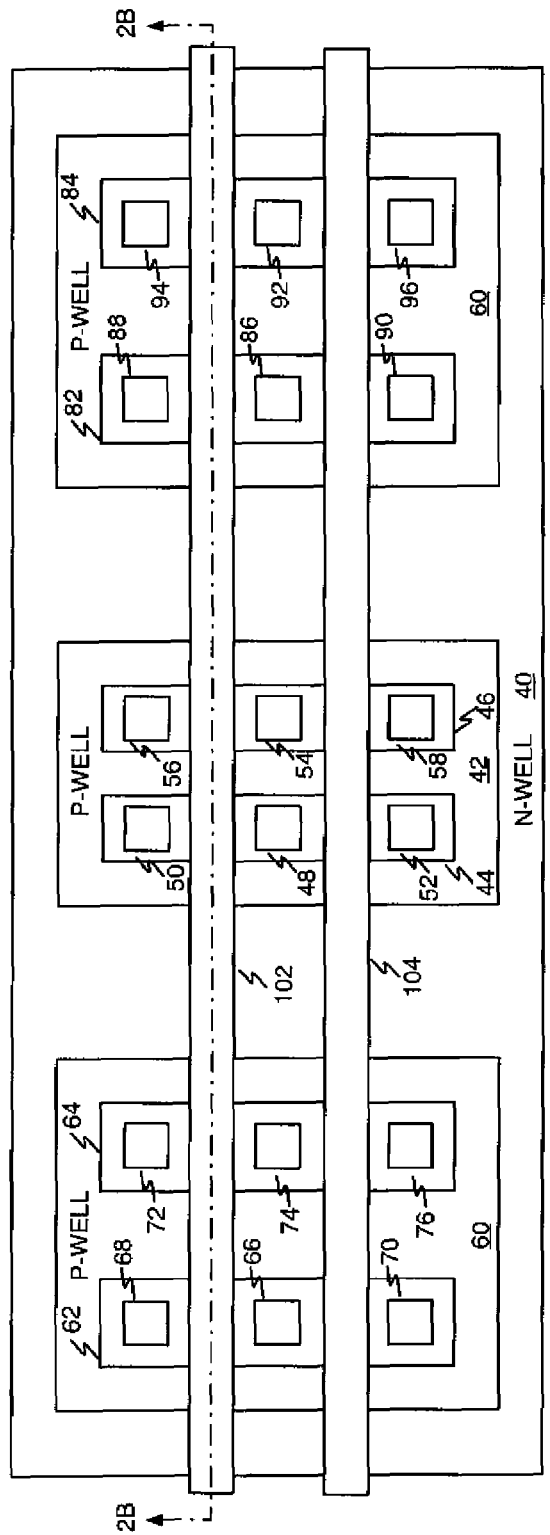
FIGS. 2A and 2B are, respectively, top and cross-sectional views of a layout of a group of two-transistor non-volatile memory cells according to one aspect of the present invention employing common high-voltage n-type well isolation.
Figure 2B:
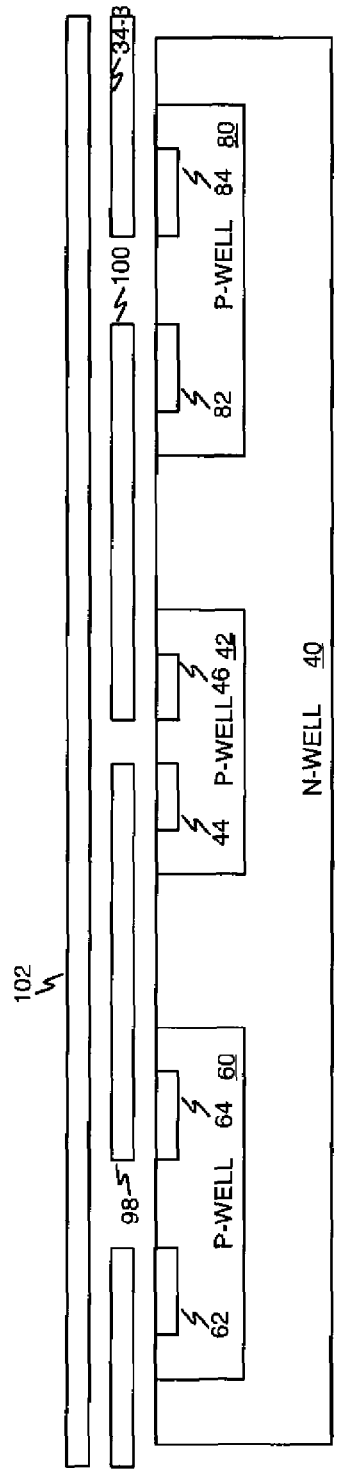

Referring now to FIGS. 2A and 2B, top and cross-sectional views, respectively, are shown of a layout of a group of two-transistor non-volatile memory cells according to one aspect of the present invention employing common high-voltage n-type well isolation. The cross section of FIG. 2B is taken through the dashed line 2B-2B of FIG. 2A.

Unlike the two-transistor non-volatile memory cells of FIGS. 1A and 1B, the two-transistor non-volatile memory cells of the present invention are distributed among different p-type wells, one for memory transistors and one for switch transistors. As in FIGS. 1A and 1B, the memory cell p-type wells are shown disposed in n-type region 40. N-type region 40 is typically an n-type well disposed in a semiconductor substrate (not shown), although persons of ordinary skill in the art will appreciate that region 40 could be another structure, such as an n-type epitaxial layer formed over a semiconductor substrate as is known in the art. N-type wells may have a depth of between about 0.5 to about 5 microns and doping concentrations of from between about 1e16 and about 1e18.

A memory-transistor p-type well 42 is disposed in the n-type well 40. P-type wells 42 may have depths of between about 0.5 to about 5 microns and may typically be about 30% deeper than the switch n-type wells 40. N-type wells 42 may be doped to from between about 1e16 and about 1e18. Active n-type regions 44 and 46 are formed in memory-transistor p-type well 42 and may have doping concentrations of from between about 1e19 and about 1e18. As will be appreciated by persons of ordinary skill in the art, a mirrored memory-transistor structure is depicted in FIG. 2A, wherein a contact 48 makes contact to a portion of active region 44 that acts as the common source for two separate memory transistors. Contact 50 makes contact to the drain region of a first (upper) one of the memory transistors and contact 52 makes contact to the drain region of a second (lower) one of the memory transistors. Similarly, contact 54 makes contact to a portion of active region 46 that acts as the common source for two separate memory transistors, contact 56 makes contact to a drain region of a first (upper) one of the memory transistors in active region 46 and contact 58 makes contact to the drain region of a second (lower) one of the memory transistors in active region 46. Thus, four separate transistors are shown disposed within memory-transistor p-type well 42.

A first switch-transistor p-type well 60 is disposed in n-type well 40 and is spaced apart from memory-transistor p-type well 42. As with memory-transistor p-type well 42, mirrored switch transistors may be employed in the present invention. Thus, active regions 62 and 64 are formed in switch-transistor p-type well 60. A contact 66 makes contact to a portion of active region 62 that acts the common source for two separate switch transistors. Contact 68 makes contact to the drain region of a first (upper) one of the switch transistors in active region 62 and contact 70 makes contact to the drain region of a second (lower) one of the switch transistors in active region 62. Similarly, contact 72 makes contact to a portion of active region 64 that acts the common source for two separate switch transistors. Contact 74 makes contact to the drain region of a first (upper) one of the memory transistors in active region 64 and contact 76 makes contact to the drain region of a second (lower) one of the memory transistors in active region 64. Thus, four separate transistors are shown disposed within switch-transistor p-type well 60.

A second switch-transistor p-type well 80 is disposed in n-type well 40 and is spaced apart from memory-transistor p-type well 42 on the side opposite from first switch-transistor p-type well 60. As with switch-transistor p-type well 60, mirrored switch transistors may be employed in second switch-transistor p-type well 80. Thus, active regions 82 and 84 are formed in switch-transistor p-type well 80. A contact 86 makes contact to a portion of active region 82 that acts as the common source for two separate switch transistors. Contact 88 makes contact to the drain region of a first (upper) one of the switch transistors in active region 82 and contact 90 makes contact to the drain region of a second (lower) one of the switch transistors in active region 82. Similarly, contact 92 makes contact to a portion of active region 84 that acts as the common source for two separate switch transistors. Contact 94 makes contact to the drain region of a first (upper) one of the memory transistors in active region 84 and contact 96 makes contact to the drain region of a second (lower) one of the memory transistors in active region 84. Thus, four separate transistors are shown disposed within switch-transistor p-type well 80.

Floating gate segment 98 (seen in FIG. 2B) is common to the upper memory transistor formed in active region 44 of memory-transistor p-type well 42 and the upper switch transistor formed in active region 64 of first switch-transistor p-type well 60. A similar floating gate (out of the plane of the cross section of FIG. 2B) is common to the lower memory transistor formed in active region 44 of memory-transistor p-type well 42 and the lower switch transistor formed in active region 62 of first switch-transistor p-type well 60. As will be appreciated by persons of ordinary skill in the art from the description so far, the two switch transistors formed in active region 64 of switch-transistor p-type well 60 are associated with a pair of memory transistors located off of the left-hand side of FIGS. 2A and 2B and thus not shown in the figures.

Floating gate segment 100 (seen in FIG. 2B) is common to the upper memory transistor formed in active region 46 of memory-transistor p-type well 42 and the upper switch transistor formed in active region 82 of second switch-transistor p-type well 80. A similar floating gate (out of the plane of the cross section of FIG. 2B) is common to the lower memory transistor formed in active region 46 of memory-transistor p-type well 42 and the lower switch transistor formed in active region 82 of second switch-transistor p-type well 80. As will also be appreciated by persons of ordinary skill in the art from the description so far, the two switch transistors formed in active region 84 of switch-transistor p-type well 80 are associated with a pair of memory transistors located off of the right-hand side of FIGS. 2A and 2B and thus not shown in the figures.

It is apparent that the group of memory cells depicted in FIGS. 2A and 2B may preferably be conveniently configured to be symmetrical about a vertical axis centered between active regions 44 and 46 in memory-transistor p-type well 42 and also about a horizontal axis running through contacts 48, 54, 62, 72, 86, and 92 in memory-transistor p-type well 42 and first and second switch transistor p-type wells 60 and 80. This feature of the present invention facilitates layout of large arrays of two-transistor memory cells for application such as large-gate-count programmable integrated circuits.

As may be seen from an examination of FIGS. 2A and 2B, control gate 102 is disposed above and aligned with floating gate segments 98 and 100. Control gate 100 is common to all of the upper memory transistors and upper switch transistors in the group depicted in FIGS. 1A and 1B, as well as to memory and switch transistors in other groups disposed within the same horizontal plane as the upper transistors shown in FIGS. 1A and 1B. Similarly, control gate 104 is disposed above and aligned with floating gate segments associated with the lower memory and switch transistors in the group that are out of the plane of the cross section of FIG. 2B. Control gate 104 is common to all of the lower memory transistors and lower switch transistors in the group depicted in FIGS. 1A and 1B, as well as to lower memory and switch transistors in other groups disposed within the same horizontal plane as the lower transistors shown in FIGS. 1A and 1B.

As will be appreciated by persons of ordinary skill in the art, the layout of the present invention permits the use of single straight segmented polysilicon lines to form all of the floating gates for the upper (and lower) memory and switch transistors of the group of two-transistor non-volatile memory cells depicted in FIGS. 1 and 2.

Such skilled persons will observe that the n-type well 40 acts to advantageously provide electrical isolation of the memory transistor in each two-transistor non-volatile memory cell from its switch transistor. This isolation, combined with the grouping of the memory transistors in a memory-transistor well and the switch transistors in a switch-transistor well, not only allows for advantageously programming and erasing of the memory cells, but also advantageously allows the wells, the memory transistors, and the switch transistors to be separately optimized for desired characteristics. For example, the memory-well depth, doping and diffusion parameters and switch-well depth, doping and diffusion parameters can be separately optimized for desired characteristics of the memory transistors (e.g., programming and erase method and efficiency) and the switch transistors (e.g., speed, current handling capability).

Referring now to FIGS. 3A and 3B, top and cross-sectional views, respectively, are shown of a layout of a group of two-transistor non-volatile memory cells according to another aspect of the present invention employing common n-type well isolation and other n-type well isolation. The cross section of FIG. 3B is taken through the dashed line 3B-3B of FIG. 3A.

The layout of the group of two-transistor non-volatile memory cells shown in FIGS. 3A and 3B is similar to that depicted in FIGS. 2A and 2B. Elements of the layout of FIGS. 3A and 3B that correspond to elements of the layout depicted in FIGS. 2A and 2B are designated in FIGS. 3A and 3B using the same reference numerals as their counterparts in FIGS. 2A and 2B.

In addition to the isolation provided by the n-type well 40, further isolation is provided by the presence of n-type well 110. As shown most clearly in FIG. 3A, n-type well 110 surrounds each of the memory-transistor p-type well 12 and the switch-transistor p-type well regions 60 and 80. As shown in FIGS. 3A and 3B, the outer edges of n-type well 110 are preferably spaced apart from the edges of the memory-transistor p-type well region 42 and the switch-transistor p-type well regions 60 and 80.

Figures 4A, 4B:
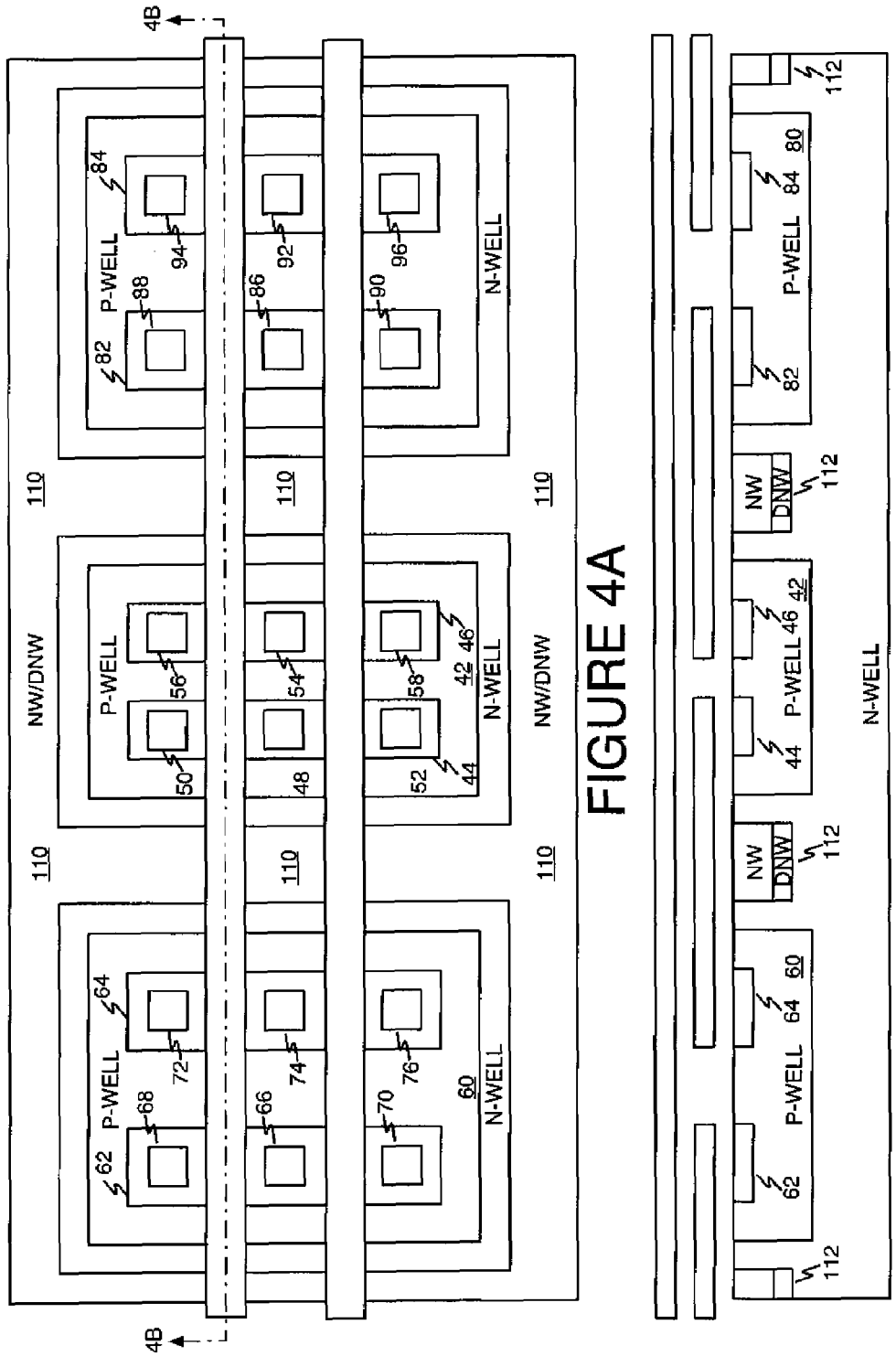
FIGS. 4A and 4B are, respectively, top and cross-sectional views of a layout of a group of two-transistor non-volatile memory cells according to another aspect of the present invention employing common n-type well isolation and n-type well isolation with underlying deep n-type well isolation.

Referring now to FIGS. 4A and 4B, top and cross-sectional views, respectively, are shown of a layout of a group of two-transistor non-volatile memory cells according to another aspect of the present invention employing common n-type well isolation and other n-type well isolation with underlying deep n-type well isolation. The cross section of FIG. 4B is taken through the dashed line 4B-4B of FIG. 4A.

The layout of the group of two-transistor non-volatile memory cells shown in FIGS. 4A and 4B is similar to that depicted in FIGS. 3A and 3B. Elements of the layout of FIGS. 4A and 4B that correspond to elements of the layout depicted in FIGS. 3A and 3B are designated in FIGS. 4A and 4B using the same reference numerals as their counterparts in FIGS. 3A and 3B.

From an examination of FIG. 4B, it may be seen that a deep n-type well region 112 is formed under n-type well region 110. Deep n-type well region 112 may be formed to a depth of between about 0.3 microns and about 3 microns deeper than the p-wells containing the transistors.

Referring now to FIGS. 5A and 5B, top and cross-sectional views, respectively, are shown of a layout of a group of two-transistor non-volatile memory cells according to another aspect of the present invention employing common n-type well isolation and other n-type well isolation with underlying deep n-type well isolation as well as enhanced p-type well isolation. The cross section of FIG. 5B is taken through the dashed line 5B-5B of FIG. 5A.

The layout of the group of two-transistor non-volatile memory cells shown in FIGS. 5A and 5B is similar to that depicted in FIGS. 4A and 4B. Elements of the layout of FIGS. 5A and 5B that correspond to elements of the layout depicted in FIGS. 4A and 4B are designated in FIGS. 5A and 5B using the same reference numerals as their counterparts in FIGS. 4A and 4B.

In addition to the n-type well regions 80 and the deep n-type well regions 112, enhanced p-type regions 114 are disposed about the periphery of the memory-transistor p-type well 42 and the switch-transistor p-type wells 60 and 80. Persons of ordinary skill in the art will also note that, instead of being spaced apart from the edges of the memory-transistor p-type well 42 and the switch-transistor p-type wells 60 and 80, the n-type wells 110 and deep n-type wells 112 are preferably located at the edges of the memory-transistor p-type well 42 and the switch-transistor p-type wells 60 and 80 as shown most clearly in FIG. 5B. The enhanced p-type regions 114 are areas of higher p-type dopant concentration. Persons of ordinary skill in the art will appreciate that, by adding the enhanced p-type regions and placing the deep n-type well regions 112 adjacent to the devices, the space-charge regions are significantly reduced. Since the space-charge regions are simply lost area, this geometry allows closer spacing of the devices and thus permits a more closely-spaced layout.

In the groups of two-transistor non-volatile memory cells presently disclosed, the n-type well regions are the most heavily doped. The deep n-type well regions 112 are doped to about 25% of the concentration of the n-type well regions 110. The n-type well regions 42 are doped to a concentration that is about an order of magnitude lower than that of the n-type well regions 110. The enhanced p-type well regions are doped to a higher than the other p-type well regions to reduce depletion regions.

Referring now to FIGS. 6A and 6B, top and cross-sectional views, respectively, are shown of a layout of a group of two-transistor non-volatile memory cells according to another aspect of the present invention employing deep-trench isolation. The cross section of FIG. 6B is taken through the dashed line 6B-6B of FIG. 6A.

As may be easily seen in both FIGS. 6A and 6B, deep-trench isolation regions 116 are disposed around each of the memory-transistor p-type well 42 and the switch-transistor p-type wells 60 and 80. As will be appreciated by persons of ordinary skill in the art, and as shown most clearly in FIG. 6B, deep-trench isolation regions 116 extend vertically down into n-type well region 42. Deep-trench isolation regions 116 are formed using known technology.

In all of the embodiments of the present invention, the memory-transistor p-type well 42 is decoupled from the switch-transistor p-type wells 60 and 80. This allows optimization of the memory-transistor p-type well 42 for program and erase efficiency and optimization of the switch-transistor p-type wells 60 and 80 for device performance. Accordingly, the switch-transistor p-type wells 50 and 80 may be formed as regular low-voltage or I/O device p-type wells. In addition, the switch-transistor source/drain implants, channel lengths and well implants may be optimized for performance characteristics such as low output impedance, and to suppress hot carrier injection programming.

Similarly, the memory-transistor source/drain implants, halo implants, well implants and channel lengths can be optimized for hot carrier injection or Fowler-Nordheim program and erase efficiency and device reliability. Depending on the junction breakdown levels, the switch transistors and the memory transistors can both be placed in low-voltage wells, or the switch transistors can be placed in a low-voltage well and the memory transistors can be placed in a high-voltage well to optimize the spacing between the wells to favorably impact memory cell size.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A two-transistor non-volatile memory cell including:
a semiconductor body;
a memory-transistor well disposed within the semiconductor body;
a switch-transistor well disposed within the semiconductor body and electrically isolated from the memory transistor well;
a memory transistor formed within the memory-transistor well and including spaced-apart source and drain regions;
a switch transistor formed within the switch-transistor well region and including spaced-apart source and drain regions;
a floating gate insulated from and self aligned with the source and drain regions of the memory transistor and the switch transistor; and
a control gate disposed above and self aligned with respect to the floating gate and with the source and drain regions of the memory transistor and the switch transistor,
wherein the memory-transistor well is optimized for memory-transistor characteristics and the switch-transistor well is optimized for switch-transistor characteristics.

2. The two-transistor non-volatile memory cell of claim 1, further including at least one additional switch transistor disposed in a switch-transistor well and sharing a floating gate and a control gate with the memory transistor.

3. The two-transistor non-volatile memory cell of claim 1, wherein:
the semiconductor body is n-type;
the memory-transistor well and the switch transistor well are both p-type wells; and
the memory transistor and the switch transistor are both n-channel transistors.

4. The two-transistor non-volatile memory cell of claim 3, wherein the semiconductor body is an n-type well disposed in a p-type semiconductor substrate.

5. The two-transistor non-volatile memory cell of claim 3, wherein:
the semiconductor body is an n-type well formed in a semiconductor substrate; and
the switch-transistor p-type well is spaced apart from the memory-transistor p-type well and is isolated from the memory transistor p-type well by the n-type well.

6. The two-transistor non-volatile memory cell of claim 5, further including at least one additional switch transistor disposed in a switch-transistor p-type well and sharing a floating gate and a control gate with the memory transistor.

7. The two-transistor non-volatile memory cell of claim 3, wherein:
the semiconductor body is a n-type well formed in a semiconductor substrate; and the switch-transistor p-type well is spaced apart from the memory-transistor p-type well and is isolated from the memory-transistor p-type well by the n-type well and by a second n-type well formed in the n-type well between the switch-transistor p-type well and the memory-transistor p-type well.

8. The two-transistor non-volatile memory cell of claim 7, further including at least one additional switch transistor disposed in a switch-transistor p-type well and sharing a floating gate and a control gate with the memory transistor.

9. The two-transistor non-volatile memory cell of claim 7, wherein edges of the second n-type well are spaced apart from edges of the memory-transistor p-type well and the switch-transistor p-type well.

10. The two-transistor non-volatile memory cell of claim 1, wherein the memory-transistor well and the switch-transistor well are formed to different depths.

11. An array of two-transistor non-volatile memory cells including:
a semiconductor body;
at least one memory-transistor well disposed within the semiconductor body;
at least one switch-transistor well disposed within the semiconductor body and electrically isolated from the at least one memory transistor well;
a plurality of memory transistors formed within the at least one memory-transistor well, each including spaced-apart source and drain regions;
a plurality of switch transistors formed within the at least one switch-transistor well region, each associated with one of the memory transistors and including spaced-apart source and drain regions;
a floating gate associated with each memory transistor, each floating gate insulated from and self-aligned with the source and drain regions of the switch transistor with which it is associated; and
a control gate associated with each memory transistor, each control gate disposed above and self aligned with its floating gate and with the source and drain regions of the at least one switch transistor with which it is associated,
wherein the at least one memory-transistor well is optimized for memory-transistor characteristics and the at least one switch-transistor well is optimized for switch-transistor characteristics.

12. The array of claim 11, further including at least one additional switch transistor disposed in a switch-transistor well and sharing a floating gate and a control gate with one of the memory transistors.

13. The array of claim 11, wherein:
the semiconductor body is n-type;
the at least one memory-transistor well and the at least one switch transistor well are both p-type wells; and
the memory transistors and the switch transistors are all n-channel transistors.

14. The array of claim 13, wherein the semiconductor body is an n-type well disposed in a p-type semiconductor substrate.

15. The array of claim 13, wherein:
the semiconductor body is a n-type well formed in a semiconductor substrate; and
the at least one switch-transistor p-type well is spaced apart from the at least one memory-transistor p-type well and is isolated from the memory transistor p-type well by the n-type well.

16. The array of claim 15, further including at least one additional switch transistor disposed in a switch-transistor p-type well and sharing a floating gate and a control gate with a memory transistor.

17. The two-transistor non-volatile memory cell of claim 13, wherein:
the semiconductor body is an n-type well formed in a semiconductor substrate; and
the at least one switch-transistor p-type well is spaced apart from the at least one memory-transistor p-type well and is isolated from the at least one memory-transistor p-type well by the n-type well and by a second n-type well formed in the n-type well between the at least one switch-transistor p-type well and the at least one memory-transistor p-type well.

18. The array of claim 17, further including at least one additional switch transistor disposed in a switch-transistor p-type well and sharing a floating gate and a control gate with a memory transistor.

19. The array of claim 11, wherein the at least one memory-transistor well and the at least one switch-transistor well are formed to different depths.

20. The array of claim 11, wherein the at least one memory-transistor well is electrically isolated from the at least one switch-transistor well by a deep-trench isolation region.

* * * * *